United States Patent
Ko et al.

(10) Patent No.: US 10,622,431 B2
(45) Date of Patent: Apr. 14, 2020

(54) DISPLAY PANEL, DISPLAY DEVICE, AND METHOD FOR MANUFACTURING THE DISPLAY PANEL

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Young Yik Ko, Beijing (CN); Xiangdan Dong, Beijing (CN); Jinsan Park, Beijing (CN); Wenbao Gao, Beijing (CN); Guobo Yang, Beijing (CN); Haijun Qiu, Beijing (CN); Wanli Dong, Beijing (CN); Benlian Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 207 days.

(21) Appl. No.: 15/772,246

(22) PCT Filed: Sep. 14, 2017

(86) PCT No.: PCT/CN2017/101768
§ 371 (c)(1),
(2) Date: Apr. 30, 2018

(87) PCT Pub. No.: WO2018/176742
PCT Pub. Date: Oct. 4, 2018

(65) Prior Publication Data
US 2020/0013840 A1  Jan. 9, 2020

(30) Foreign Application Priority Data

Mar. 31, 2017 (CN) .......................... 2017 1 0209783

(51) Int. Cl.
*H01L 27/32* (2006.01)
*H01L 51/52* (2006.01)
*H01L 51/56* (2006.01)

(52) U.S. Cl.
CPC ...... *H01L 27/3276* (2013.01); *H01L 51/5281* (2013.01); *H01L 51/56* (2013.01); *H01L 2227/323* (2013.01)

(58) Field of Classification Search
CPC ....................... H01L 27/3276; H01L 51/5281
See application file for complete search history.

(56) References Cited

U.S. PATENT DOCUMENTS 6,690,032 B1  2/2004 Umetsu
2014/0184057 A1  7/2014 Kim et al.

FOREIGN PATENT DOCUMENTS

CN  1318182 A  10/2001
CN  103842898  6/2014
(Continued)

OTHER PUBLICATIONS

International Search Report corresponding to International Patent Application No. PCT/CN2017/101768, dated Jan. 4, 2018.
(Continued)

*Primary Examiner* — Amar Movva
(74) *Attorney, Agent, or Firm* — Arent Fox LLP; Michael Fainberg (57) ABSTRACT

The disclosure discloses a display panel, a display device, and a method for manufacturing the display panel, where a chip on film is adhered on a frame edge of a side of a display substrate away from a display face of the display substrate through an insulation adhesive, and then signal lines on a frame edge of the display face of the display substrate are connected with connection terminals arranged on a side of the chip on film away from the display substrate through an
(Continued)

electrically conductive material in a plurality of connection holes running through the display substrate, the insulation adhesive and the chip on film, so a pad bending process can be dispensed with, and there will be no pad bending area on the frame edge of the display panel, thus further narrowing a bezel of the display panel.

17 Claims, 6 Drawing Sheets

(56) References Cited

FOREIGN PATENT DOCUMENTS

| | | |
|---|---|---|
| CN | 104465604 | 3/2015 |
| CN | 104904327 A | 9/2015 |
| CN | 107093606 | 8/2017 |
| JP | 10293319 A | 11/1998 |

OTHER PUBLICATIONS

Chinese First Office Action, Application No. 201710209783.8 dated Mar. 31, 2017.

DISPLAY PANEL, DISPLAY DEVICE, AND METHOD FOR MANUFACTURING THE DISPLAY PANEL

This application is a U.S. National Stage of International Application No. PCT/CN2017/101768, filed on Sept. 14, 2017, designating the United States and claiming priority to Chinese Patent Application No. 201710209783.8, filed with the Chinese Patent Office on Mar. 31, 2017, and entitled "A display panel, a display device, and a method for manufacturing the display panel", which is hereby incorporated by reference in its entirety.

FIELD

The present disclosure relates to the field of display technologies, and particularly to a display panel, a display device, and a method for manufacturing the display panel.

BACKGROUND

With the constant development of display technologies, a display panel has been increasingly widely applied to a display product, and a display product with a narrow bezel (which is a narrow lower frame edge) has been favored by a lot of consumers because it can provide a user with a better watching experience.

Figure 1:
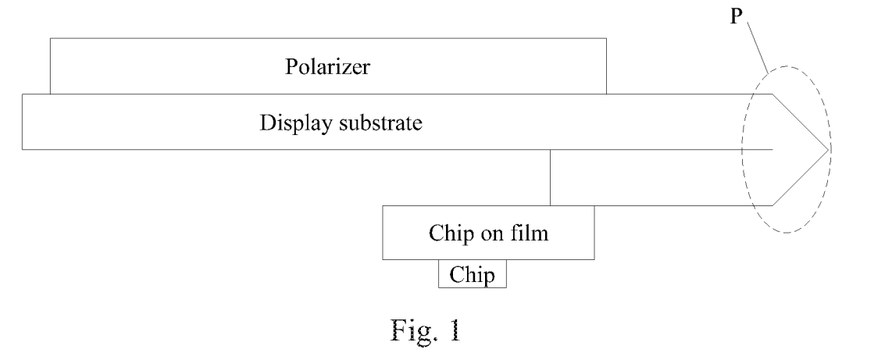
FIG. 1 is a schematic structural diagram of the display panel in the prior art.

At present, the display product with the narrow bezel is manufactured through pad bending, for example. However the display product manufactured with the pad bending process may suffer from a low yield, and as illustrated in FIG. 1, for example, an inorganic insulation layer in a pad bending area P is cracked, thus resulting in a display failure. In the prior art, the inorganic insulation layer in the pad bending area P is removed in an additional mask process, and thereafter an organic insulation layer is further formed in the pad bending area P in another additional mask process, to thereby avoid the inorganic insulation layer in the pad bending area P from being cracked which would result in a display failure. As such, the process difficulty and the manufacturing cost may be increased, and the manufacturing efficiency may be lowered, due to the two additional mask processes, although the inorganic insulation layer can be avoided to some extent from being cracked which would result in a display failure.

SUMMARY

An embodiment of the disclosure provides a display panel including; a display substrate, a chip on film arranged on a frame edge of a side of the display substrate away from a display face of the display substrate, an insulation adhesive filled between the display substrate and the chip on film, and an integrated circuit chip fixed on a side of the chip on film away from the display substrate, wherein: the chip on film is fixed on the frame edge of the side of the display substrate away from the display face through the insulation adhesive; and there are a plurality of connection holes running through the display substrate, the insulation adhesive and the chip on film, and an electrically conductive material filled in the respective connection holes, on the frame edge; and signal lines located on a frame edge of the display face of the display substrate are connected with connection terminals arranged on the side of the chip on film away from the display substrate through the electrically conductive material.

An embodiment of the disclosure provides a display device including the display panel.

An embodiment of the disclosure provides a method for manufacturing a display panel, the method including: installing an integrated circuit chip on a chip on film; adhering the chip on film on a frame edge of a side of a display substrate away from a display face of the display substrate through an insulation adhesive, wherein the integrated circuit chip is located on a side of the chip on film away from the display substrate; forming a plurality of connection holes, running through the display substrate, the insulation adhesive and the chip on film, on a frame edge of the display face of the display substrate; and filling an electrically conductive material in the respective connection holes so that signal lines located on the frame edge of the display face of the display substrate are connected with connection terminals arranged on the side of the chip on film away from the display substrate through the electrically conductive material.

DETAILED DESCRIPTION OF THE EMBODIMENTS

A display panel, a display device, and a method for manufacturing the display panel according to the embodiments of the disclosure will be described below in details with reference to the drawings.

The thicknesses, shapes, and sizes of respective layers in the drawings are not intended to reflect any real proportion of a display panel, but only intended to illustrate the disclosure of the disclosure.

Figure 2A:
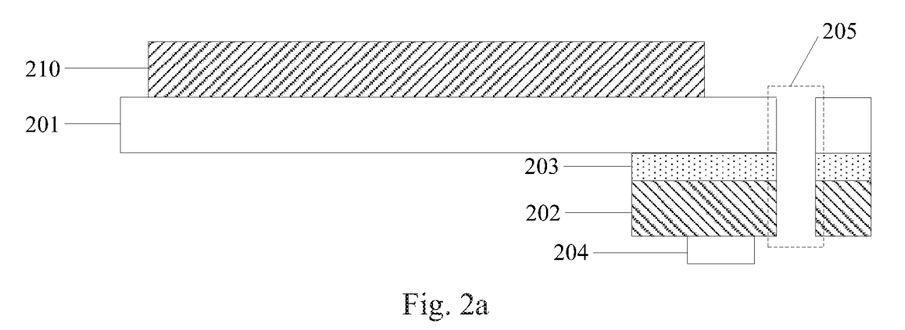
FIG. 2a and FIG. 2b are schematic structural diagrams respectively of a display panel according to an embodiment of the disclosure.
Figure 2B:
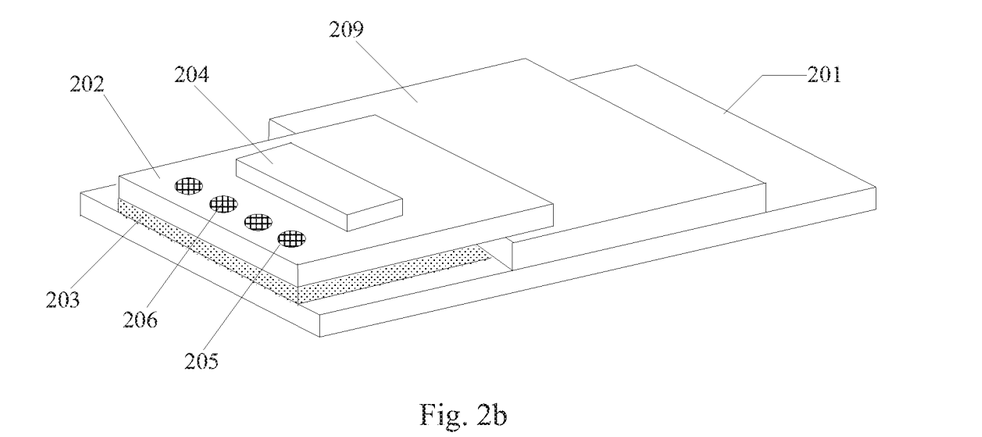

As illustrated in FIG. 2a and FIG. 2b, a display panel according to an embodiment of the disclosure includes: a display substrate 201, a Chip On Film (COF) 202 arranged on the frame edge of the side of the display substrate 201 away from a display face of the display substrate 201, an insulation adhesive 203 filled between the display substrate 201 and the chip on film 202, and an integrated circuit chip 204 fixed on the side of the chip on film 202 away from the display substrate 201.

The chip on film 202 is fixed on the frame edge of the side of the display substrate 210 away from the display face through the insulation adhesive 203.

Figure 7:
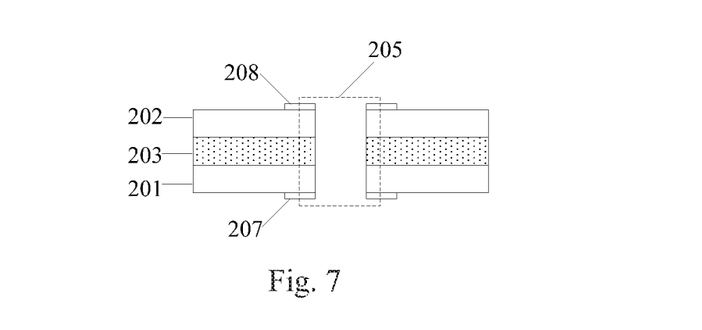
FIG. 7 is a schematic sectional view of FIG. 6d along the AA line.

There are arranged on the frame edge a plurality of connection holes 205 running through the display substrate 201, the insulation adhesive 203 and the chip on film 202, and an electrically conductive material 206 filled in the respective connection holes 205, where as illustrated in FIG. 7, the signal lines 207 located on the frame edge of the display face of the display substrate 201 are connected with connection terminals 208 arranged on the side of the chip on film 202 away from the display substrate 201 through the electrically conductive material 206 filled in the connection holes 205.

In the display panel above according to the embodiment of the disclosure, the chip on film 202 is adhered on the frame edge of the side of the display substrate 201 away from the display face through the insulation adhesive 203, and then the signal lines 207 on the frame edge of the display face of the display substrate 201 are connected with the connection terminals 208 arranged on the side of the chip on film 202 away from the display substrate 201 through the electrically conductive material 206 in the plurality of connection holes 205 running through the display substrate 201, the insulation adhesive 203 and the chip on film 202, so not only a pad bending process can be dispensed with, but also there will be no pad bending area on the frame edge of the display panel, thus further narrowing a bezel of the display panel.

Furthermore in the display panel above according to the embodiment of the disclosure, the signal lines located on the frame edge of the display face of the display substrate are connected with the connection terminals arranged on the side of the chip on film away from the display substrate through the connection holes running through the display substrate, the insulation adhesive and the chip on film, as opposed to the existing display panel in which the signal lines on the frame edge of the display face are electrically connected with the connection terminals arranged on the chip on film in a bonding process, so a bonding process for the COF can be dispensed with in the display panel above according to the embodiment of the disclosure to thereby avoid the problem of a bonding resistance arising from the bonding process, and any bonding related process problem so as to lower the difficulty of the process and to improve the yield of the process, as compared with the existing display panel.

In a particular implementation, the width of the bezel of the existing display panel is approximately 3.5 mm, and the width of the bezel of the display panel above according to the embodiment of the disclosure can be below 2 mm.

Figure 3:
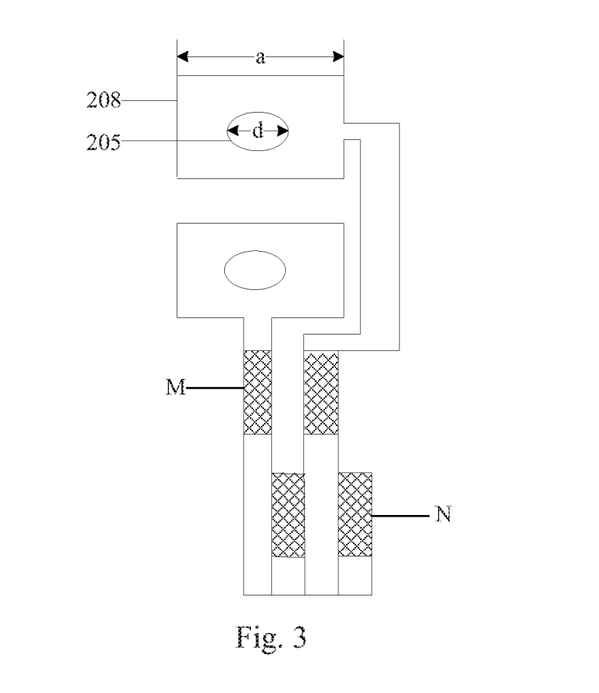
FIG. 3 is a schematic structural diagram of a connection hole and a connection terminal according to an embodiment of the disclosure.
Figure 4:
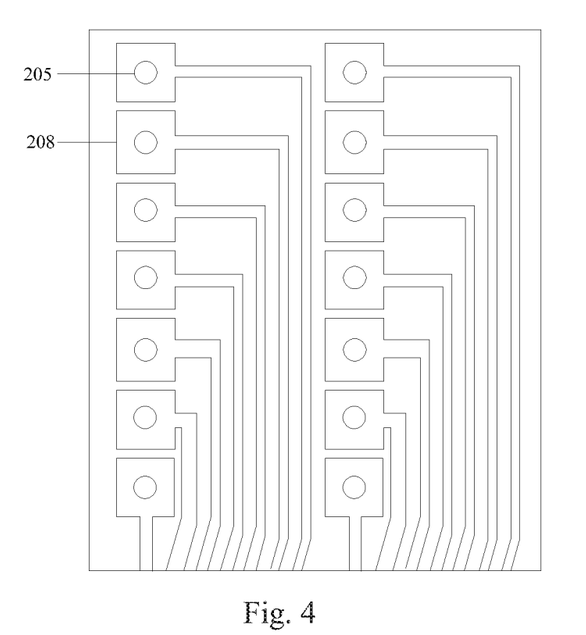
FIG. 4 is a schematic diagram of a connection relationship between a signal line at the frame edge of a display face of a display substrate, and a connection terminal arranged on the side of a chip on film away from the display substrate, according to an embodiment of the disclosure.

In a particular implementation, in order to enable the signal lines 207 on be frame edge of the display face of the display substrate 201 to be connected with the connection terminals 208 on the side of the chip on film 202 away from the display substrate 201, in the display panel above according to the embodiment of the disclosure, the connection holes 205 can correspond to the connection terminals 208 in a one-to-one manner; and the size a of the connection terminals 208 is larger than the diameter d of the connection holes 205, as illustrated in FIG. 3 and FIG. 4.

It shall be noted that in the display panel above according to the embodiment of the disclosure, the connection terminals 208 can be in any shape, e.g., a triangle, a square, or a round, although the embodiment of the disclosure will not be limited thereto. Furthermore when the shape of the connection terminals 208 is a round, the diameter of the connection terminals 208 is larger than the diameter d of the connection holes 205; and when the shape of the connection terminals 208 is a square, the length a of side of the connection terminals 208 is larger than the diameter of the connection holes 205.

Furthermore in the display panel above according to the embodiment of the disclosure, the connection terminals 208 on the side of the chip on film 202 away from the display substrate 201 need to be connected with the integrated circuit chip 204 as illustrated in FIG. 3, and particularly the connection terminals 208 are electrically connected with terminals M (shadowed as illustrated) connected with pins of the integrated circuit chip 204 through wires, where the terminals M connected with the connection terminals 208 through the wires are typically arranged at the same layer as the connection terminals 208; and terminals N which are not connected with the connection terminals may or may not be arranged at the same layer as the connection terminals 208, although the embodiment of the disclosure will not be limited thereto.

Generally there are a large number of dense connection terminals 208 on the side of the chip on film 202 away from the display substrate 201, and in order to fabricate efficiently and rapidly the connection holes 205 corresponding to the connection terminals 208 in a one-to-one manner, a laser slotting process can be performed in the display panel above according to the embodiment of the disclosure.

In a particular implementation, the connection holes 205 with a desirable diameter and depth can be fabricated by controlling the diameter and energy of a laser beam. Of course, the connection holes 205 can alternatively be fabricated in another slotting process well known to those skilled in the art, although the embodiment of the disclosure will not be limited thereto.

In a particular implementation, the smallest diameter of a hole that can be formed in the laser slotting process is 25 μm at present, and in the display panel above according to the embodiment of the disclosure, the diameter d of the respective connection holes 205 is larger than or equal to 25 μm as illustrated in FIG. 3, that is, the minimum value of the diameter d of the respective connection holes 205 can be 25 μm. Of course, the diameter thereof can be smaller if this is feasible in the process, although the embodiment of the disclosure will not be limited thereto.

In a particular implementation, in the display panel above according to the embodiment of the disclosure, the electrically conductive material 206 filled in the through-holes can be a metal material. Of course, the electrically conductive material 206 can alternatively be another electrically conductive material, e.g., tin indium oxide, zinc indium oxide, or graphene, although the embodiment of the disclosure will not be limited thereto.

In a particular implementation, in the display panel above according to the embodiment of the disclosure, the display substrate 201 can particularly be any model of display substrate, and optionally the display substrate 201 can be a flexible display substrate, e.g., an Organic Light-Emitting Diode (OLED) display substrate or a Quantum Dot Light-Emitting Diode (QLED) display substrate, although the embodiment of the disclosure will not be limited thereto.

Generally charges and control signals required for driving pixels in the display panel come from an externally connected Flexible Printed Circuit (FPC), and need to be transmitted into the display panel through the chip on film 202, so the display panel above according to the embodiment of the disclosure can further include a flexible printed circuit 209 bound on the side of the chip on film 202 facing the display substrate 201 as illustrated in FIG. 2b.

Furthermore in order to display an image on the display panel, the display panel above according to the embodiment of the disclosure can further include a polarizer (Pol) 210 which is adhered in a display area of the display face of the display substrate 201.

Based upon the same inventive idea, an embodiment of the disclosure provides a method for manufacturing a display panel, and since the manufacturing method addresses the problem under a similar principle to the display panel above, reference can be made to the implementation of the display panel above according to the embodiment of the disclosure for an implementation of the manufacturing method according to the embodiment of the disclosure, and a repeated description thereof will be omitted.

Figure 5:
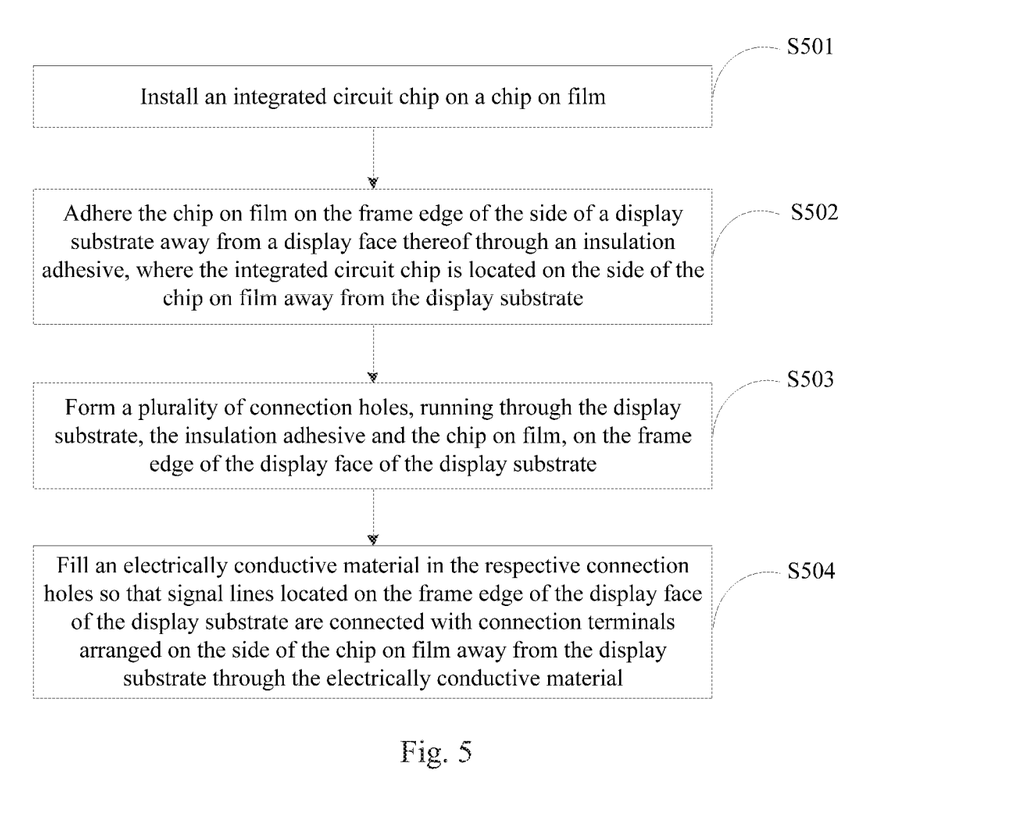
FIG. 5 is a flow chart of a method for manufacturing a display panel according to an embodiment of the disclosure.

Particularly as illustrated in FIG. 5, a method for manufacturing a display panel according to an embodiment of the disclosure can include the following steps.

S501 is to install an integrated circuit chip on a chip on film.

S502 is to adhere the chip on film on the frame edge of the side of a display substrate away from a display face thereof through an insulation adhesive, where the integrated circuit chip is located on the side of the chip on film away from the display substrate.

S503 is to form a plurality of connection holes, running through the display substrate, the insulation adhesive and the chip on film, on the frame edge of the display face of the display substrate.

S504 is to fill an electrically conductive material in the respective connection holes so that signal lines located on the frame edge of the display face of the display substrate are connected with connection terminals arranged on the side of the chip on film away from the display substrate through the electrically conductive material.

In a particular implementation, in the manufacturing method above according to the embodiment of the disclosure, forming the plurality of connection holes, running through the display substrate, the insulation adhesive and the chip on film, on the frame edge of the display face of the display substrate in the step S504 can particularly include the following step.

Forming the plurality of connection holes, running through the display substrate, the insulation adhesive and the chip on film, on the frame edge of the display face of the display substrate by controlling the diameter and energy of a laser beam in a laser slotting process, where no special treatment will be performed on a platform for placing the display substrate thereon in the laser slotting process, thus resulting in a lower cost.

Of course, in a real application, the connection holes can alternatively be fabricated in another slotting process, well known to those skilled in the art, although the embodiment of the disclosure will not be limited thereto.

In a particular implementation, in the manufacturing method above according to the embodiment of the disclosure, before the chip on film is adhered on the frame edge of the side of the display substrate away from the display face through the insulation adhesive in the step S502, the method can further include the following step.

Binding a flexible printed circuit on the side of the chip on film away from the integrated circuit chip.

In a particular implementation, in the manufacturing method above according to the embodiment of the disclosure, firstly the integrated circuit chip can be installed on the chip on film, and then the flexible printed circuit can be bound on the side of the chip on film away from the integrated circuit chip; or firstly the flexible printed circuit can be bound on one side of the chip on film, and then the integrated circuit chip can be installed on the side of the chip on film away from the flexible printed circuit; or the flexible printed circuit can be bound on the side of the chip on film away from the integrated circuit chip at the same time the integrated circuit chip is installed on the chip on film, although the embodiment of the disclosure will not be limited thereto.

In order to better understand the technical solution of the disclosure, FIG. 6a to FIG. 6d and FIG. 2b illustrate schematic structural diagrams of the display panel after performing the respective steps in the manufacturing method above.

Figure 6A:
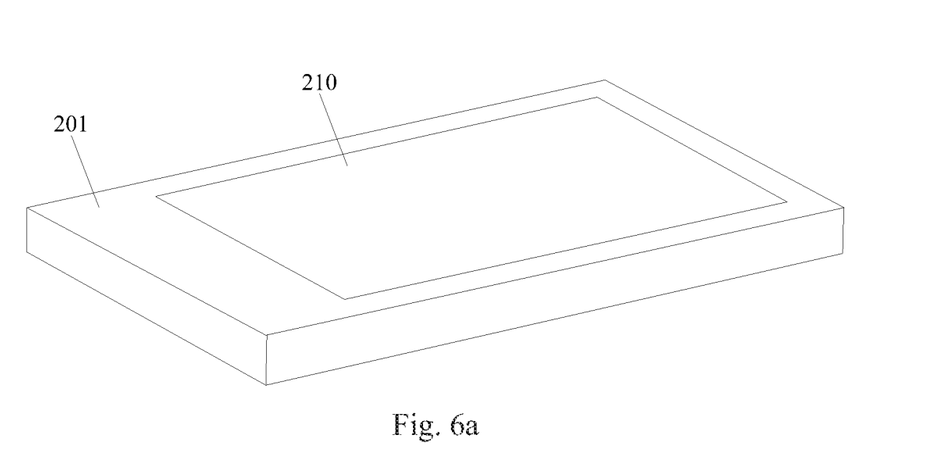
FIG. 6a to FIG. 6d are schematic structural diagrams respectively of a display panel after performing respective steps in a method for manufacturing the display panel according to an embodiment of the disclosure.

The display substrate 201 is provided, and the polarizer 210 is adhered in display area of the display face of the display substrate 201, as illustrated in FIG. 6a.

Figure 6B:
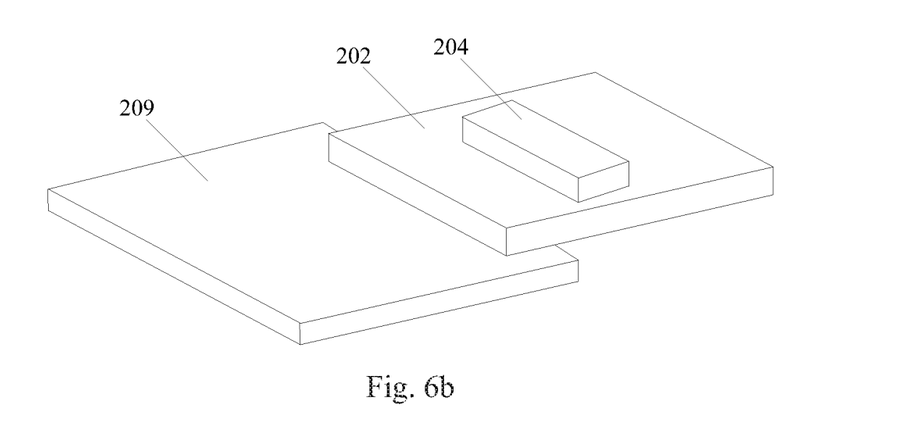

The integrated circuit chip 204 is installed on the chip on film 202, and also the flexible printed circuit 209 is bound on the side of the chip on film 202 away from the integrated circuit chip 204, as illustrated in FIG. 6b.

Figure 6C:
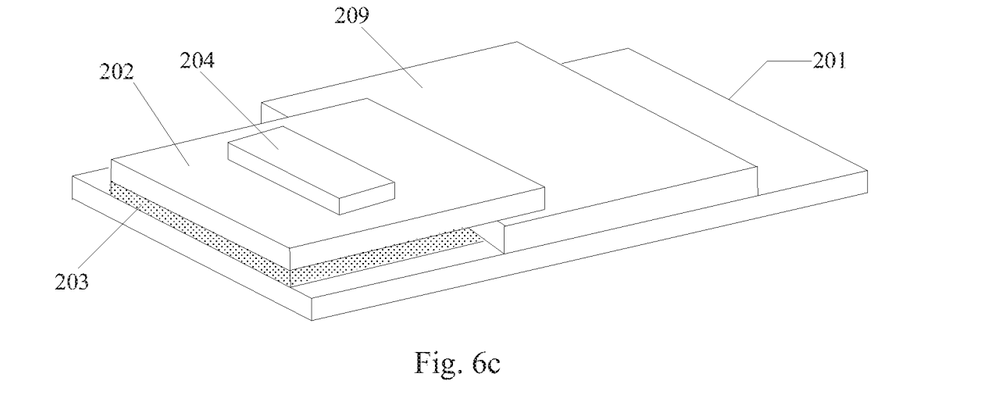

The chip on film 202 is adhered on the frame edge of the side of the display substrate 201 away from the display face through the insulation adhesive 203, and the integrated circuit chip 204 is located on the side of the chip on film 202 away from the display substrate 201, as illustrated in FIG. 6c.

Figure 6D:
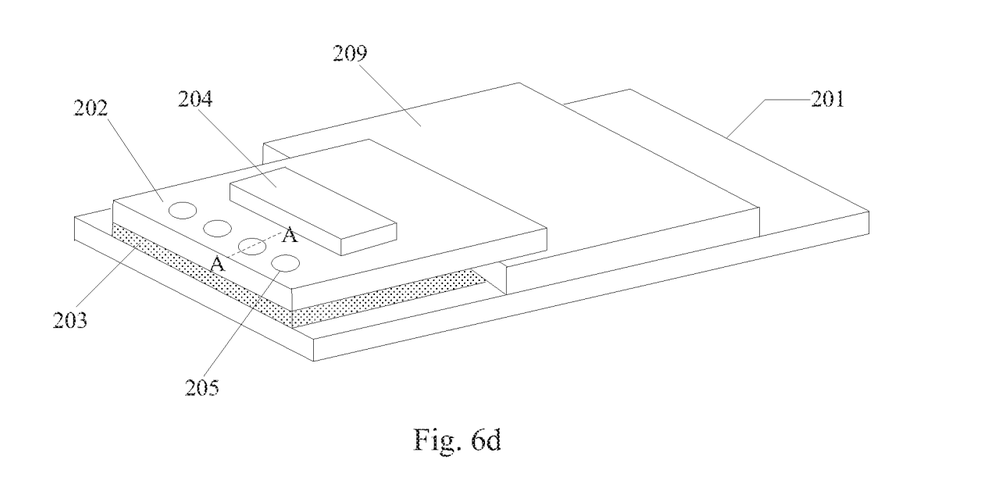

The plurality of connection holes 205 running through the display substrate 201, the insulation adhesive 203 and the chip on film 202 are formed on the frame edge of the display face of the display substrate 201 in a laser slotting process, as illustrated in FIG. 6d and FIG. 7.

Optionally the respective connection holes 205 correspond in a one-to-one manner with the respective connection terminals 208 on the side of the chip on film 202 away from the display substrate 201, and the size of the connection terminals 208 is larger than the diameter of the connection holes 205.

The electrically conductive material 206 is filled in the respective connection holes 205 so that the signal lines 207 located on the frame edge of the display face of the display substrate 201 are connected with the connection terminals 208 arranged on the side of the chip on film 202 away from the display substrate 201.

Based upon the same inventive idea, an embodiment of the disclosure further provides a display device including the display panel above according to the embodiment of the disclosure, and the display device can be a mobile phone, a tablet computer, a TV set, a monitor, a notebook computer, a digital photo frame, a navigator, or any product component capable of displaying. Reference can be made to the embodiment of the display panel above for an implementation of the display device, so a repeated description thereof will be omitted here.

In the display panel, the display device, and the method for manufacturing the display panel above according to the embodiments of the disclosure, the display panel includes: a display substrate, a Chip On Film (COF) arranged on the frame edge of the side of the display substrate away from a display face thereof, an insulation adhesive filled between the display substrate and the chip on film, and an integrated circuit chip fixed on the side of the chip on film away from the display substrate, where the chip on film is fixed on the frame edge of the side of the display substrate away from the display face through the insulation adhesive; and there are arranged on the frame edge a plurality of connection holes running through the display substrate, the insulation adhesive and the chip on film, and an electrically conductive material filled in the respective connection holes; and signal lines located on the frame edge of the display face of the display substrate are connected with connection terminals arranged on the side of the chip on film away from the display substrate through the electrically conductive material. The chip on film is adhered on the frame edge of the side of the display substrate away from the display face through the insulation adhesive, and then the signal lines on the frame edge of the display face of the display substrate are connected with the connection terminals arranged on the side of the chip on film away from the display substrate through the electrically conductive material in the plurality of connection holes running through the display substrate, the insulation adhesive and the chip on film, so not only a pad bending process can be dispensed with, but also there will be no pad bending area on the frame edge of the display panel, thus further narrowing a bezel of the display panel.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising:
    a display substrate, comprising a frame edge and a plurality of signal lines on the frame edge of a display face of the display substrate;
    a chip on film, on the frame edge of a side of the display substrate away from the display face, comprising a plurality of connection terminals on a side of the chip on film away from the display substrate;
    an insulation adhesive between the display substrate and the chip on film;
    an integrated circuit chip on the side of the chip on film away from the display substrate;
    a plurality of connection holes, running through the display substrate, the insulation adhesive and the chip on film; and
    an electrically conductive material in the respective connection holes;
    wherein:
    the chip on film is fixed on the frame edge of the side of the display substrate away from the display face through the insulation adhesive; and
    the signal lines are connected with the connection through the electrically conductive material.

2. The display panel according to claim 1, wherein the connection holes correspond to the connection terminals in a one-to-one manner.

3. The display panel according to claim 2, wherein the diameter of the connection holes is larger than or equal to 25 μm.

4. The display panel according to claim 1, wherein the electrically conductive material is a metal material.

5. The display panel according to claim 1, wherein the display substrate is an Organic Light-Emitting Diode (OLED) display substrate or a Quantum Dot Light-Emitting Diode (QLED) display substrate.

6. The display panel according to claims 1, wherein the display panel further comprises a flexible printed circuit bound on a side of the chip on film facing the display substrate.

7. A display device, comprising a display panel, the display panel comprising: a display substrate, comprising a frame edge and a plurality of signal lines on the frame edge of a display face of the display substrate;
    a chip on film, on the frame edge of a side of the display substrate away from the display face, comprising a plurality of connection terminals on a side of the chip on film away from the display substrate;
    an insulation adhesive between the display substrate and the chip on film;
    an integrated circuit chip on the side of the chip on film away from the display substrate;
    a plurality of connection holes, running through the display substrate, the insulation adhesive and the chip on film; and
    an electrically conductive material in the respective connection holes;
    wherein:
    the chip on film is fixed on the frame edge of the side of the display substrate away from the display face through the insulation adhesive; and
    the signal lines are connected with the connection terminals through the electrically conductive material.

8. A method for manufacturing a display panel, the method comprising:
    installing an integrated circuit chip on a chip on film;
    adhering the chip on film on a frame edge of a side of a display substrate away from a display face of the display substrate through an insulation adhesive, wherein the integrated circuit chip is located on a side of the chip on film away from the display substrate;
    forming a plurality of connection holes through the display substrate, the insulation adhesive and the chip on film, on a frame edge of the display face of the display substrate; and
    forming an electrically conductive material in the respective connection holes so that signal lines located on the frame edge of the display face of the display substrate are connected with connection terminals arranged on the side of the chip on film away from the display substrate through the electrically conductive material.

9. The manufacturing method according to claim 8, wherein forming the plurality of connection holes through the display substrate, the insulation adhesive and the chip on film, on the frame edge of the display face of the display substrate comprises:
    forming the plurality of connection holes, running through the display substrate, the insulation adhesive and the chip on film, on the frame edge of the display face of the display substrate by controlling a diameter and energy of a laser beam in a laser slotting process.

10. The manufacturing method according to claim 8, wherein before the chip on film is adhered on the frame edge of the side of the display substrate away from the display face through the insulation adhesive, the method further comprises:
    binding a flexible printed circuit on a side of the chip on film away from the integrated circuit chip.

11. The display panel according to claim 1, wherein a size of the connection terminals is larger than a diameter of the connection holes.

12. The display device according to claim 7, wherein the connection holes correspond to the connection terminals in a one-to-one manner.

13. The display device according to claim 7, wherein a size of the connection terminals is larger than a diameter of the connection holes.

14. The display device according to claim 13, wherein the diameter of the connection holes is larger than or equal to 25 μm.

15. The display device according to claim 7, wherein the electrically conductive material is a metal material.

16. The display device according to claim 7, wherein the display substrate is an Organic Light-Emitting Diode (OLED) display substrate or a Quantum Dot Light-Emitting Diode (QLED) display substrate.

17. The display device according to claim 7, wherein the display panel further comprises a flexible printed circuit bound on a side of the chip on film facing the display substrate.

* * * * *